(12) United States Patent
Chen et al.

(10) Patent No.: US 12,196,496 B2
(45) Date of Patent: Jan. 14, 2025

(54) LIQUID-COOLED COOLING STRUCTURE

(71) Applicant: AIC INC., Taoyuan (TW)

(72) Inventors: Yen-Chih Chen, Taoyuan (TW); Chi-Fu Chen, Taoyuan (TW); Wei-Ta Chen, Taoyuan (TW); Hung-Hui Chang, Taoyuan (TW)

(73) Assignee: AIC INC., Taoyuan (TW)

( * ) Notice: Subject to any disclaimer, the term of this patent is extended or adjusted under 35 U.S.C. 154(b) by 258 days.

(21) Appl. No.: 17/952,286

(22) Filed: Sep. 25, 2022

(65) Prior Publication Data

US 2024/0102742 A1    Mar. 28, 2024

(51) Int. Cl.
*F28D 15/00* (2006.01)
*F28D 15/02* (2006.01)

(52) U.S. Cl.
CPC ..... *F28D 15/0266* (2013.01); *F28D 15/0275* (2013.01)

(58) Field of Classification Search
CPC ............ F28D 15/0266; F28D 15/0275; F28D 15/0233
See application file for complete search history.

(56) References Cited

U.S. PATENT DOCUMENTS

| | | | | |
|---|---|---|---|---|
| 3,205,147 A * | 9/1965 | Foure | ..................... | F28F 27/02 376/455 |
| 3,913,664 A * | 10/1975 | Roukis | .................. | F28D 15/046 138/40 |
| 4,554,966 A * | 11/1985 | Vasiliev | .............. | F28D 15/0266 392/394 |
| 4,951,740 A * | 8/1990 | Peterson | ............... | H01L 23/427 165/80.4 |
| 5,076,351 A * | 12/1991 | Munekawa | ......... | F28D 15/0233 165/104.31 |
| 5,187,030 A * | 2/1993 | Firmin | .............. | H01M 10/6553 429/120 |
| 5,253,702 A * | 10/1993 | Davidson | ............ | F28D 15/0266 29/890.032 |
| 5,358,033 A * | 10/1994 | Schlitt | ................. | F28D 15/0258 122/366 |
| 5,427,174 A * | 6/1995 | Lomolino, Sr. | ..... | F28D 15/0233 165/104.33 |
| 5,632,158 A * | 5/1997 | Tajima | .................. | F28D 15/046 165/104.33 |
| 5,647,430 A * | 7/1997 | Tajima | .................... | F28F 3/025 257/E23.099 |

(Continued)

*Primary Examiner* — Travis Ruby
(74) *Attorney, Agent, or Firm* — Chun-Ming Shih; HDLS IPR SERVICES

(57) ABSTRACT

A liquid-cooled cooling structure includes a cooling main body having a condensation chamber and an evaporation chamber arranged vertically therein; a separation member arranged between and separating the condensation chamber and the evaporation chamber, and having a first through hole and a second through hole communicating with the condensation chamber and the evaporation chamber, a dimension of the first through hole being greater than that of the second through hole; a longitudinal partition board received in the condensation chamber and arranged between the first through hole and the second through hole and separating the condensation chamber into a first channel and a second channel; cooling fins extended from an outer perimeter of the cooling main body.

10 Claims, 8 Drawing Sheets

(56) References Cited

U.S. PATENT DOCUMENTS

| | | | | |
|---|---|---|---|---|
| 5,871,043 | A * | 2/1999 | Osakabe | F28D 15/0266 165/104.21 |
| 5,998,863 | A * | 12/1999 | Kobayashi | F28F 3/12 361/699 |
| 6,341,646 | B1 * | 1/2002 | Tanaka | F28D 15/0266 165/104.21 |
| 6,561,262 | B1 * | 5/2003 | Osakabe | F28F 1/40 165/104.21 |
| 6,725,909 | B1 * | 4/2004 | Luo | F28F 1/24 174/15.2 |
| 6,889,756 | B1 * | 5/2005 | Hou | H01L 23/427 174/15.2 |
| 7,269,013 | B2 * | 9/2007 | Chen | H01L 23/427 361/709 |
| 8,780,562 | B2 * | 7/2014 | Yang | F21V 29/713 361/709 |
| 9,423,192 | B2 * | 8/2016 | Tsoi | F28D 15/0233 |
| 10,712,099 | B2 * | 7/2020 | Hoshino | F28D 15/06 |
| 2005/0019234 | A1 * | 1/2005 | Luo | F28D 15/0233 422/198 |
| 2005/0263267 | A1 * | 12/2005 | Yu | F28D 15/0233 257/E23.088 |
| 2007/0102143 | A1 * | 5/2007 | Yu | H01L 23/427 165/104.33 |
| 2007/0272399 | A1 * | 11/2007 | Nitta | F28D 15/046 165/185 |
| 2008/0110599 | A1 * | 5/2008 | Reyzin | H01L 23/467 165/104.33 |
| 2008/0144319 | A1 * | 6/2008 | Chang | H05K 1/0206 362/294 |
| 2009/0242174 | A1 * | 10/2009 | McCutchen | F01K 25/08 165/104.25 |
| 2009/0260793 | A1 * | 10/2009 | Wang | F28D 15/025 165/181 |
| 2009/0301694 | A1 * | 12/2009 | Zhou | H01L 23/427 165/185 |
| 2009/0308575 | A1 * | 12/2009 | Yao | F21V 29/76 165/80.3 |
| 2012/0186798 | A1 * | 7/2012 | Meyer, IV | F28D 15/0233 165/181 |
| 2013/0223063 | A1 * | 8/2013 | Lee | F21V 29/717 362/235 |
| 2015/0060020 | A1 * | 3/2015 | Yang | F28D 15/0275 165/104.26 |
| 2017/0059254 | A1 * | 3/2017 | Zhang | F28D 15/0233 |
| 2022/0139581 | A1 * | 5/2022 | Dulloo | G21C 15/257 376/100 |
| 2022/0319949 | A1 * | 10/2022 | Pentikäinen | H01L 23/4006 |
| 2023/0047466 | A1 * | 2/2023 | Jiang | F28D 15/0266 |

* cited by examiner

LIQUID-COOLED COOLING STRUCTURE

BACKGROUND

Technical Field

The technical field relates to a cooling structure utilizing circulation of a working fluid for cooling, and in particular, to a liquid-cooled cooling structure.

Description of Related Art

A related-art cooling device mainly utilizes a heat conduction plate attached to a heat source and a heat sink formed of a plurality of fins thereon and attached to the heat conduction plate. Accordingly, heat is transmitted from the heat source to the fins or heat sink via the heat conduction plate to achieve the effect of cooling.

In addition, as the demand for cooling increases, the cooling device may be further installed with a fan or a water-cooling device externally for cooling. The heat conduction plate may further use a heat pipe or a vaporer chamber equipped with a coolant or a working fluid therein to increase the efficiency of cooling.

However, for the heat transmission of a related-art cooling device, heat concentration often occurs at the heat source area, and the accumulated heat accumulated at the heat source area cannot be effectively transmitted, such that the cooling efficiency cannot be further increased.

In view of the above, the inventor seeks to overcome the aforementioned drawbacks associated with the current technology and aims to provide an effective solution through extensive researches along with utilization of academic principles and knowledge.

SUMMARY

The present disclosure provides a liquid-cooled cooling structure, having a first through hole of a larger hole diameter for a gaseous working fluid to enter, and the working fluid is guided to flow to an evaporation chamber via the first channel and the second channel sequentially.

In an exemplary embodiment of the present disclosure, the present disclosure provides a liquid-cooled cooling structure including: a cooling main body having at least one condensation chamber and at least one evaporation chamber arranged parallelly along a vertical direction in an internal thereof; a separation member arranged between and separating the at least condensation chamber and the at least one evaporation chamber, having at least one first through hole and at least one second through hole communicating with the at least one condensation chamber and the at least one evaporation chamber, and a dimension of the first through hole being greater than a dimension of the second through hole; at least one longitudinal partition board received in the at least one condensation chamber and arranged between the at least one first through hole and the at least one second through hole, the longitudinal partition board separating the condensation chamber into a first channel and a second channel, the first channel and the second channel communicating with each other at one ends thereof, the first channel communicating with the first through hole at another end, and the second channel communicating with the second through hole at another end; and a plurality of cooling fins extended from an outer perimeter of the cooling main body.

Accordingly, since the dimension of the first through hole is greater than the dimension of the second through hole, the pressure difference between the working fluid flowing through the first through hole and the second through hole forms a fixed circulating cooling direction to guide the working fluid to stably and swiftly flow from the first through hole, the first channel, the second channel and the second through hole to the evaporation chamber in sequence, thereby allowing the heat of the evaporation chamber to be effectively dissipated and to prevent heat accumulation, such that the liquid-cooled cooling structure may achieve desirable cooling efficiency.

DETAILED DESCRIPTION

Figure 1:
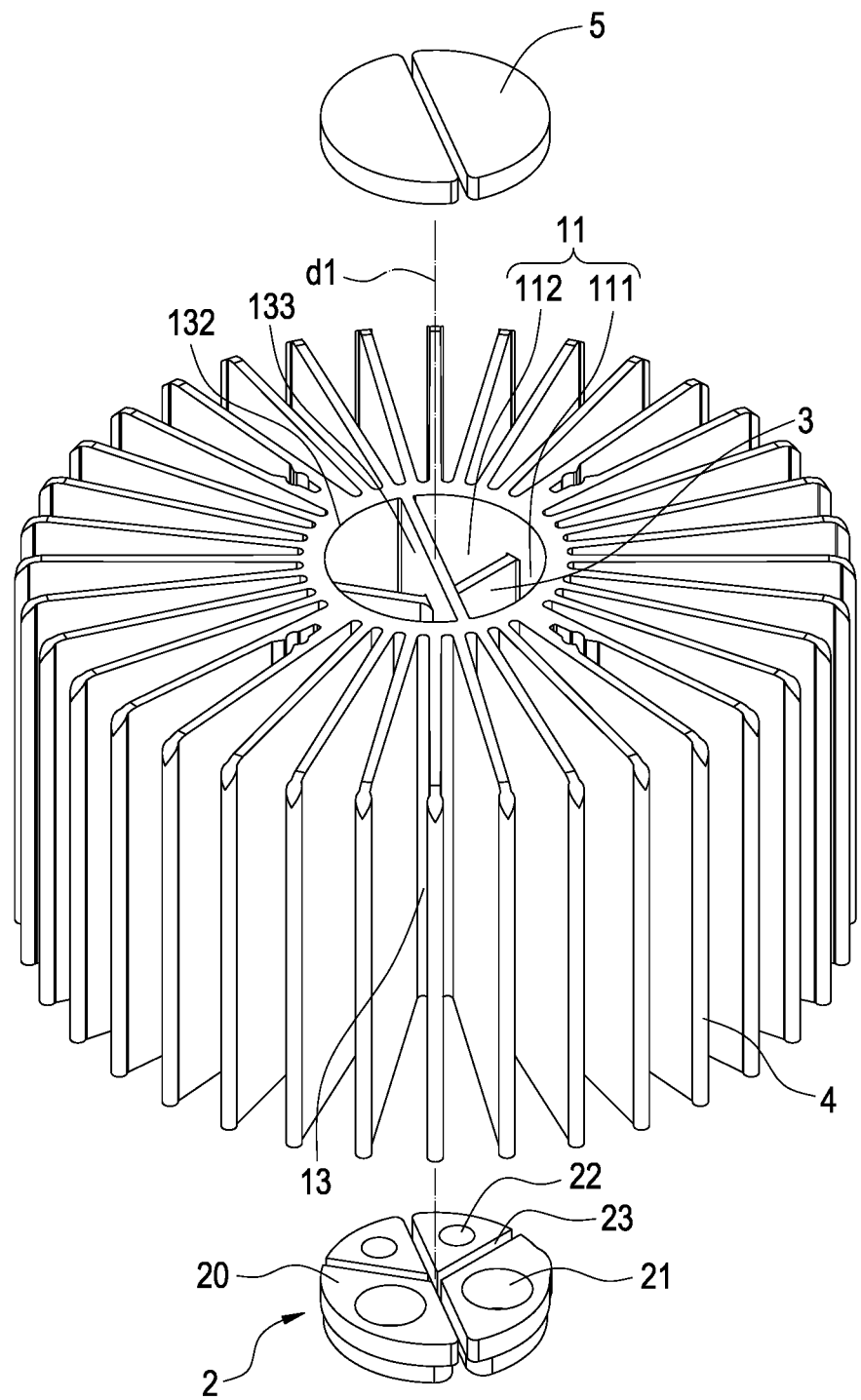
FIG. 1 is a perspective exploded view of the liquid-cooled cooling structure of the present disclosure.
Figure 2:
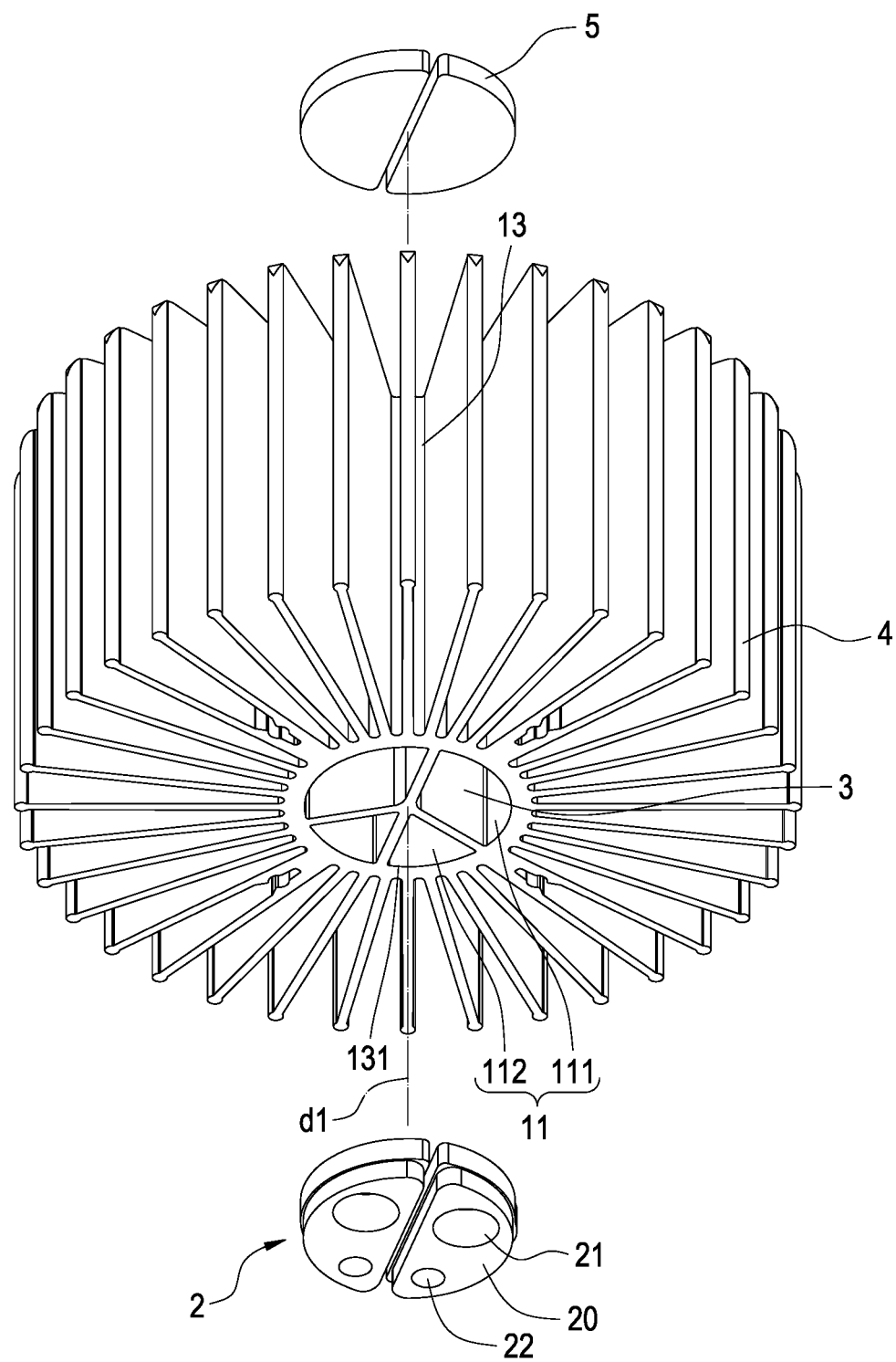
FIG. 2 is another perspective exploded view of the liquid-cooled cooling structure of the present disclosure.
Figure 3:
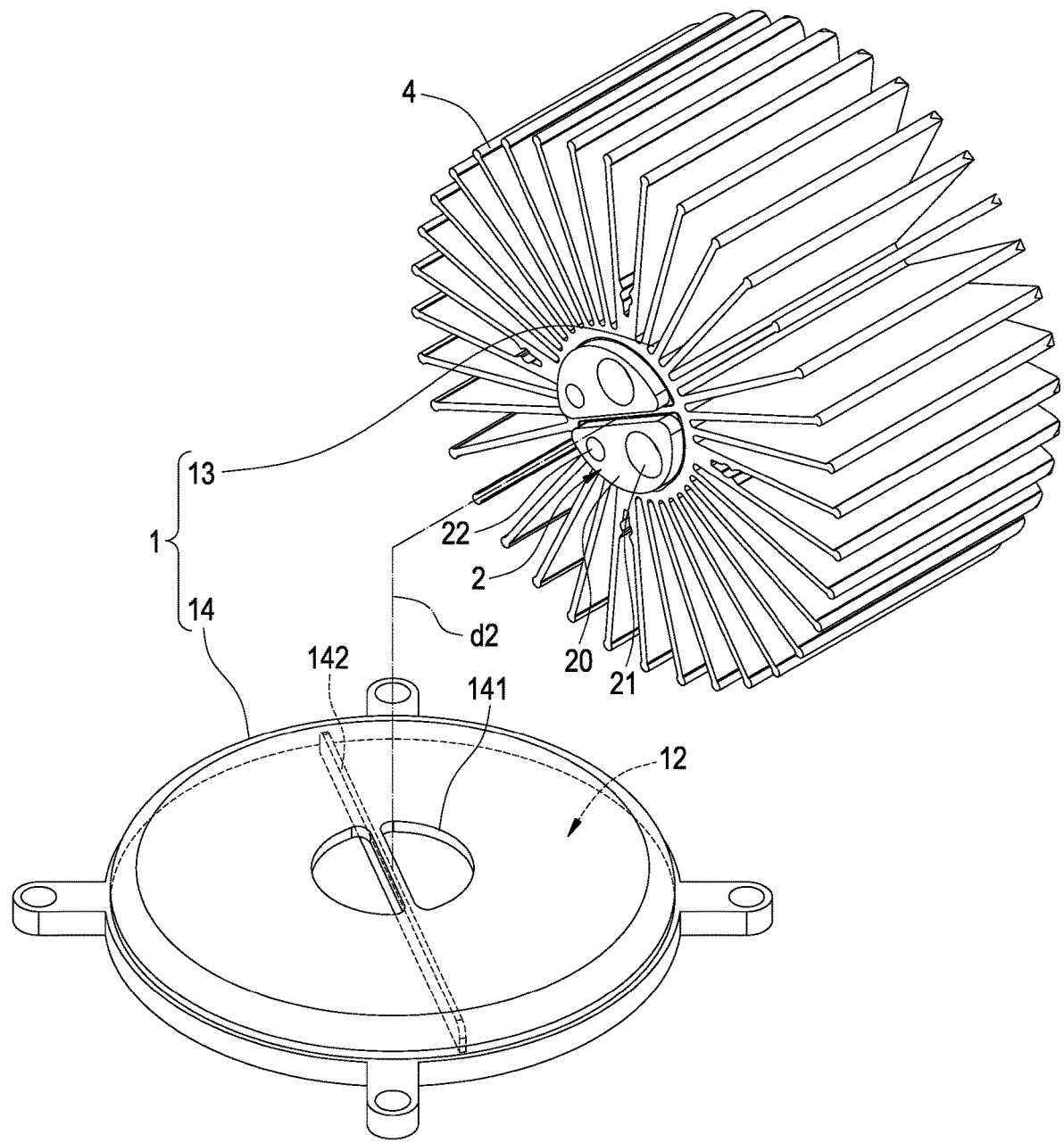
FIG. 3 is still another perspective exploded view of the liquid-cooled cooling structure of the present disclosure.
Figure 4:
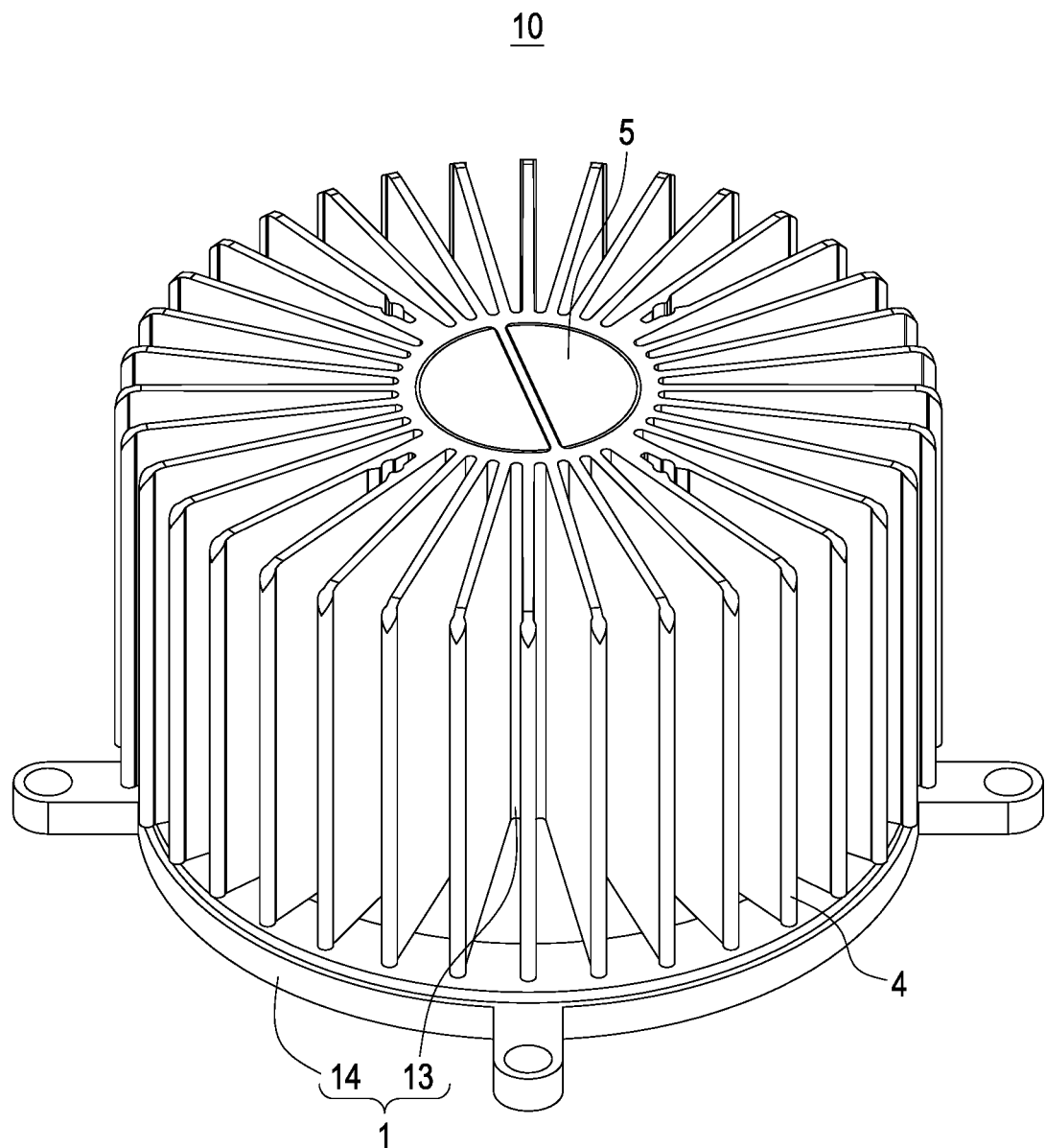
FIG. 4 is a perspective assembly view of the liquid-cooled cooling structure of the present disclosure.

The technical contents of this disclosure will become apparent with the detailed description of embodiments and the accompanied drawings as follows. However, it shall be noted that the accompanied drawings for illustrative purposes only such that they shall not be used to restrict the scope of the present disclosure.

Please refer to FIG. 1 to FIG. 7. The present disclosure provides a liquid-cooled cooling structure, and the liquid-cooled cooling structure 10 mainly includes a cooling main body 1, a separation member 2, at least one longitudinal partition board 3 and a plurality of cooling fins 4.

As shown in FIG. 1 to FIG. 7, when the liquid-cooled cooling structure 10 is placed vertically, the cooling main body 1 includes at least one condensation chamber 11 and at least one evaporation chamber 12 arranged parallelly along the vertical direction in the internal thereof. In other words, one or multiple condensation chambers 11 are arranged on top of one or multiple evaporation chambers 12.

To be more specific, the cooling main body 1 includes a hollow column 13 and a disk housing 14 stacked onto each other vertically. An internal of the hollow column 13 includes the condensation chamber 11 and two ends of hollow column 13 include a first opening 131 and a second opening 132 communicating with the condensation chamber 11. An internal of the disk housing 14 includes the evaporation chamber 12 formed therein and a central top portion of the disk housing 14 includes at least one penetrating hole 141 communicating with the evaporation chamber 12, and the first opening 131 and the penetrating hole 141 are arranged opposite to each other.

In addition, the quantity of the condensation chamber 11 in this exemplary embodiment is multiple, the present disclosure is not limited to such arrangement only. The hollow column 13 includes a first axial line d1 defined therein. The plurality of condensation chambers 11 are divided by one or multiple first vertical separation sheets 133. The first vertical separation sheet 133 is extended between two sides of an inner perimeter of the hollow column 13 to intersect with the first axial line d1 and disposed along the first axial line d1, such that the condensation chambers 11 separated by the first vertical sheet 133 are also disposed along the first axial line d1. In addition, the quantity of the first vertical separation sheet 133 in this exemplary embodiment is one, the present disclosure is not limited to such arrangement only.

Furthermore, the quantity of the evaporation chamber 12 is the same with the quantity of the condensation chamber 11. Accordingly, the quantity of the evaporation chamber 12 in this exemplary embodiment is multiple, the present disclosure is not limited to such arrangement only. The disk housing 14 includes a second axial line d2 defined therein. The plurality of evaporation chambers 12 are divided by one or multiple second vertical separation sheets 142. The second vertical separation sheet 142 is extended from an inner top wall, an inner bottom wall and two sides of an inner perimeter of the disk housing 14 to intersect with the second axial line d2, and disposed along the second axial line d2, such that the evaporation chambers 12 separated by the second vertical sheet 142 are also disposed along the second axial line d2. In addition, the quantity of the second vertical separation sheet 142 in this exemplary embodiment is one, the present disclosure is not limited to such arrangement only.

As shown in FIG. 1 to FIG. 3, FIG. 5 and FIG. 7, the separation member 2 fills and seals the first opening 131 and the penetrating hole 141, such that the separation member 2 is arranged between the condensation member 11 and the evaporation member 12 and separates the condensation chamber 11 and the evaporation chamber 12. The separation member 2 includes a first through hole 21 and a second through hole 22 communicating with the condensation chamber 11 and the evaporation chamber 12, and a dimension of the first through hole 21 is greater than a dimension of the second through hole 22.

As shown in FIG. 1 to FIG. 2, FIG. 5 and FIG. 7, the longitudinal partition board 3 is received in the condensation chamber 11, and arranged between the first through hole 21 and the second through hole 22. The longitudinal partition board 3 separates the condensation chamber 11 into a first channel 111 and a second channel 112. The first channel 111 and the second channel 112 communicate with each other at one end thereof. The first channel 111 communicates with the first through hole 21 at another end. The second channel 112 communicates with the second through hole 22 at another end.

Furthermore, the quantity of the longitudinal partition board 3 is the same with the quantity of the condensation chamber 11. Accordingly, the quantity of the longitudinal partition board 3 in this exemplary embodiment is multiple, the present disclosure is not limited to such arrangement only. Two sides of each one of the longitudinal partition boards 3 are extended from the inner perimeter of the hollow column 13 and the first vertical separation sheet 133 and are disposed along the first axial line d1.

As shown in FIG. 1 to FIG. 5 and FIG. 7, the plurality of cooling fins 4 are extended from the outer perimeter of the cooling main body 1. To be more specific, the plurality of cooling fins 4 are extended from the outer perimeter of the hollow column 13.

As shown in FIG. 1 to FIG. 2, FIG. 4 and FIG. 7, the liquid-cooled cooling structure 10 of the present disclosure further includes at least one sealing cap 5. The sealing cap 5 covers and seals the second opening 132.

In addition, in this exemplary embodiment, the quantities of the first opening 131, the second opening 132, the penetrating hole 141, the first through hole 21, the second through hole 22, the slot 23 and the sealing cap 5 are the same with the quantity of the condensation chamber 11 such that their quantities are also multiple respectively the present disclosure is not limited to such arrangement only.

Furthermore, each one of the first through holes 21 and each one of the second through holes 22 communicate with each one of the condensation chambers 11 and each one of the evaporation chambers 12. Each one of the longitudinal partition boards 3 is received in each one of the condensation chambers 11 and is arranged between each one of the first through holes 21 and each one of the second through holes 22. Each one of the penetrating holes 141 communicates with each one of the evaporation chambers 12. Each one of the slots 23 is arranged between each one of the first through holes 21 and each one of the second through holes 22. Each one of the first openings 131 and each one of the second opening 132 communicate with each one of the condensation chambers 11. Each one of the sealing caps 5 covers and seals each one of the second openings 132.

Moreover, the separation member 2 includes a plurality of lateral partition boards 20. Each one of the first through holes 21 and each one of the second through holes 22 are formed on each one of the lateral partition boards 20. The upper half section of each one of the lateral partition boards 20 fills and seals each one of the first openings 131. The second half section of each one of the lateral partition boards 20 fills and seals each one of the penetrating holes 141.

In addition, a top portion of each one of the lateral partition boards 20 includes a slot 23 arranged between each one of the first through holes 21 and each one of the second through holes 22. A spacing S is formed between one end of each one of the longitudinal partition boards 3 and each one of the sealing caps 5, and another end of each longitudinal partition board 3 is inserted into each one of the slots 23. Accordingly, one end of each one of the first channels 111 communicates with each one of the second channels 112 and another end of the first channel 111 communicates with the first through hole 21. One end of each one of the second channels 112 communicate with each one of the first channels 111 and another end of the second channel 112 communicates with the second through hole 22.

Furthermore, the inner perimeter of the hollow column 13 and an outer side of the at least one first vertical partition sheet 133 jointly and circumferentially form an inner perimeter of the plurality of first openings 131 and an inner perimeter of the plurality of second openings 132.

Figure 6:
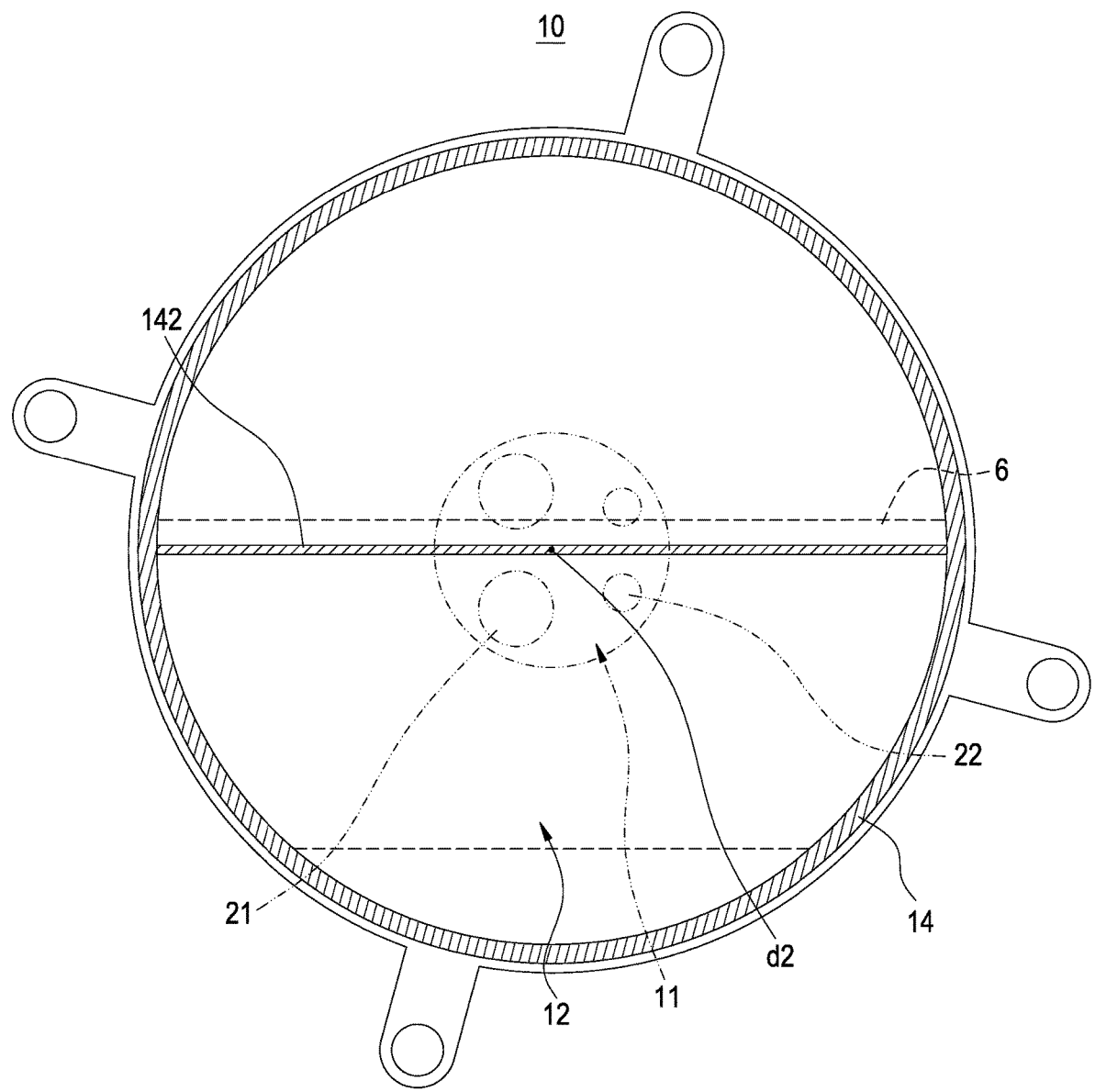
FIG. 6 is another assembly cross-sectional view of the liquid-cooled cooling structure of the present disclosure.

As shown in FIG. 6, the liquid-cooled cooling structure 10 of the present disclosure further includes a working fluid 6. The working fluid 6 is coolant, and the working fluid 6 is received in the condensation chamber 11 and the evaporation chamber 12.

Figure 5:
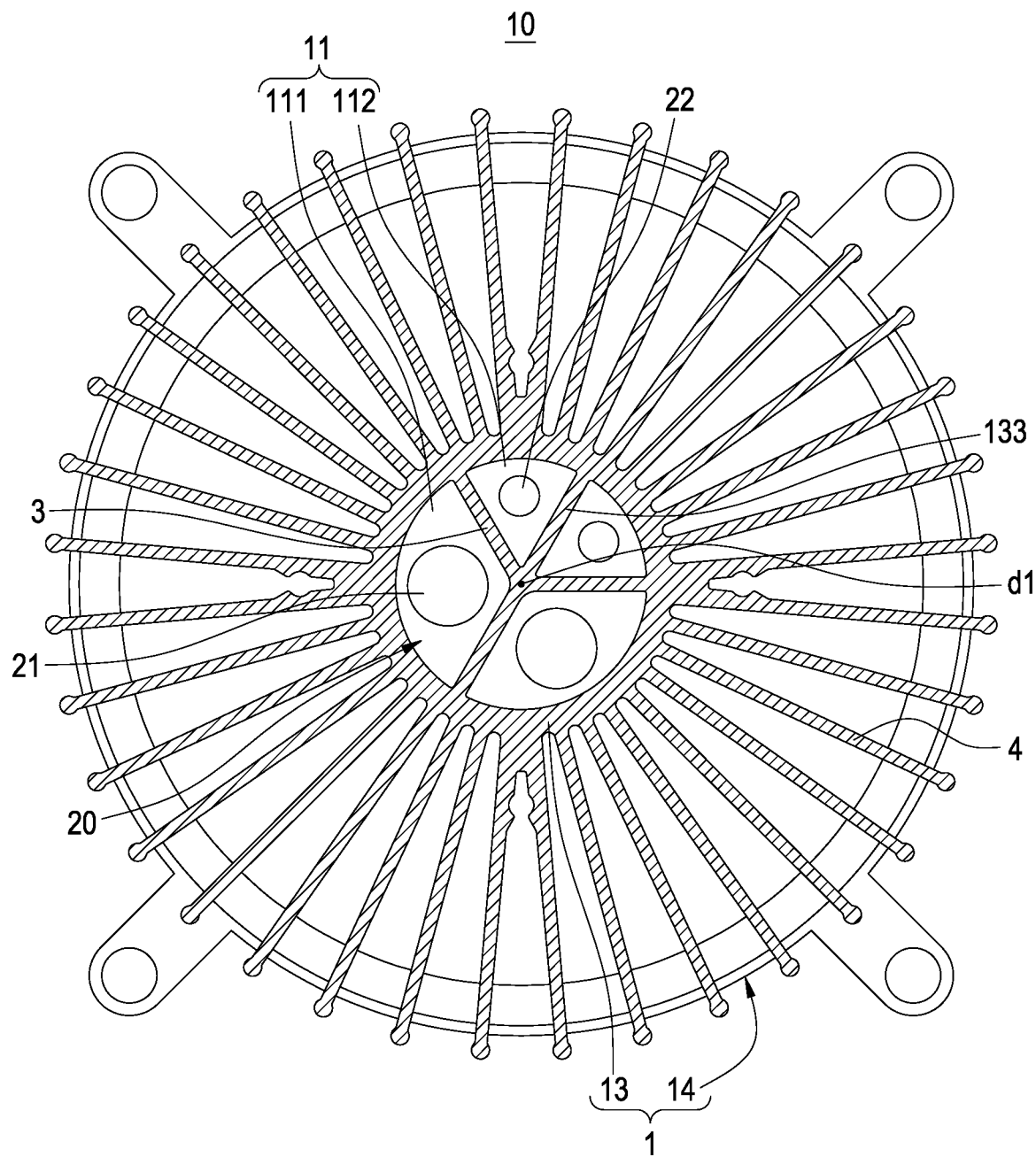
FIG. 5 is an assembly cross-sectional view of the liquid-cooled cooling structure of the present disclosure.
Figure 7:
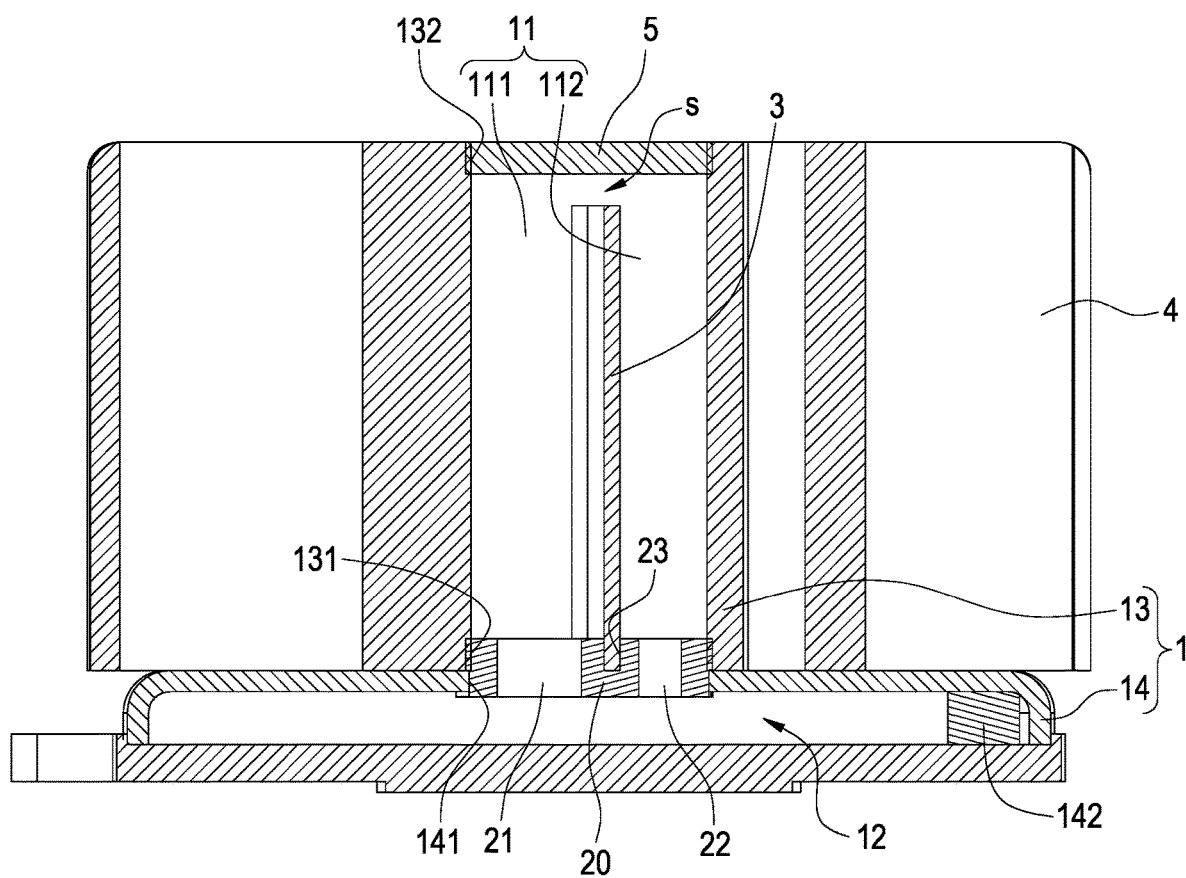
FIG. 7 is a cross-sectional view taken along the sectional line between two points shown in FIG. 5.

As shown in FIG. 5 to FIG. 7, according to a state of use of the liquid-cooled cooling system of the present disclosure, the bottom surface of the disk housing 14 is attached to a heat source (not shown in the drawings), and the evaporation chamber 12 is formed at a location where the cooling main body 1 is attached to the heat source. The liquid working fluid 6 received inside the evaporation chamber 12 vaporizes due to heat and becomes a gaseous working fluid 6. The gaseous working fluid 6 may select the first through hole 21 of a greater hole dimension for entering the first channel 111, such that the working fluid 6 may automatically flow through the first through hole 21 of a greater hole diameter, the first channel 111, the spacing S, the second channel 112 and the second through hole 22 of a smaller hole diameter sequentially. Since the gaseous working fluid 6 transmits heat to the cooling fins 4, it may be cooled to become the liquid working fluid 6 at the condensation chamber 11. Finally, the liquid working fluid 6 flows back to the evaporation chamber 12 via the second through hole 22 of a smaller hole diameter.

Accordingly, since the dimension of the first through hole 21 is greater than the dimension of the second through hole 22, the pressure difference between the working fluid 6 flowing through the first through hole 21 and the second through hole 22 may form a fixed circulating cooling direction to guide the working fluid 6 to stably and swiftly flow from the first through hole 21, the first channel 111, the second channel 112 and the second through hole 22 to the evaporation chamber 12 in sequence, thereby allowing the heat of the evaporation chamber 12 to be effectively dissipated and prevented from heat accumulation, such that the liquid-cooled cooling structure 10 may to achieve outstanding cooling efficiency.

In addition, please refer to FIG. 6. When the liquid-cooled cooling structure 10 is placed horizontally, since the first vertical separation sheet 133 divides the internal of the hollow column 13 into half to form two condensation chambers 11 with the first axial line d1 as the central line, and the second vertical separation sheet 142 divides the internal of the disk housing 14 into half to form two evaporation chambers 12 with the second axial line d2 as the central line, the internal of the cooling main body 1 is evenly divided into two sections with the center point as the datum point, and each section is also uniformly filled with the working fluid 6, thereby ensuring that the central area of the disk housing 14 that is typically attached to the heat source contains a predefined amount of the working fluid 6. In other words, it is able to ensure that a predefined amount of working fluid 6 maintains direct contact with the heat source.

Figure 8:
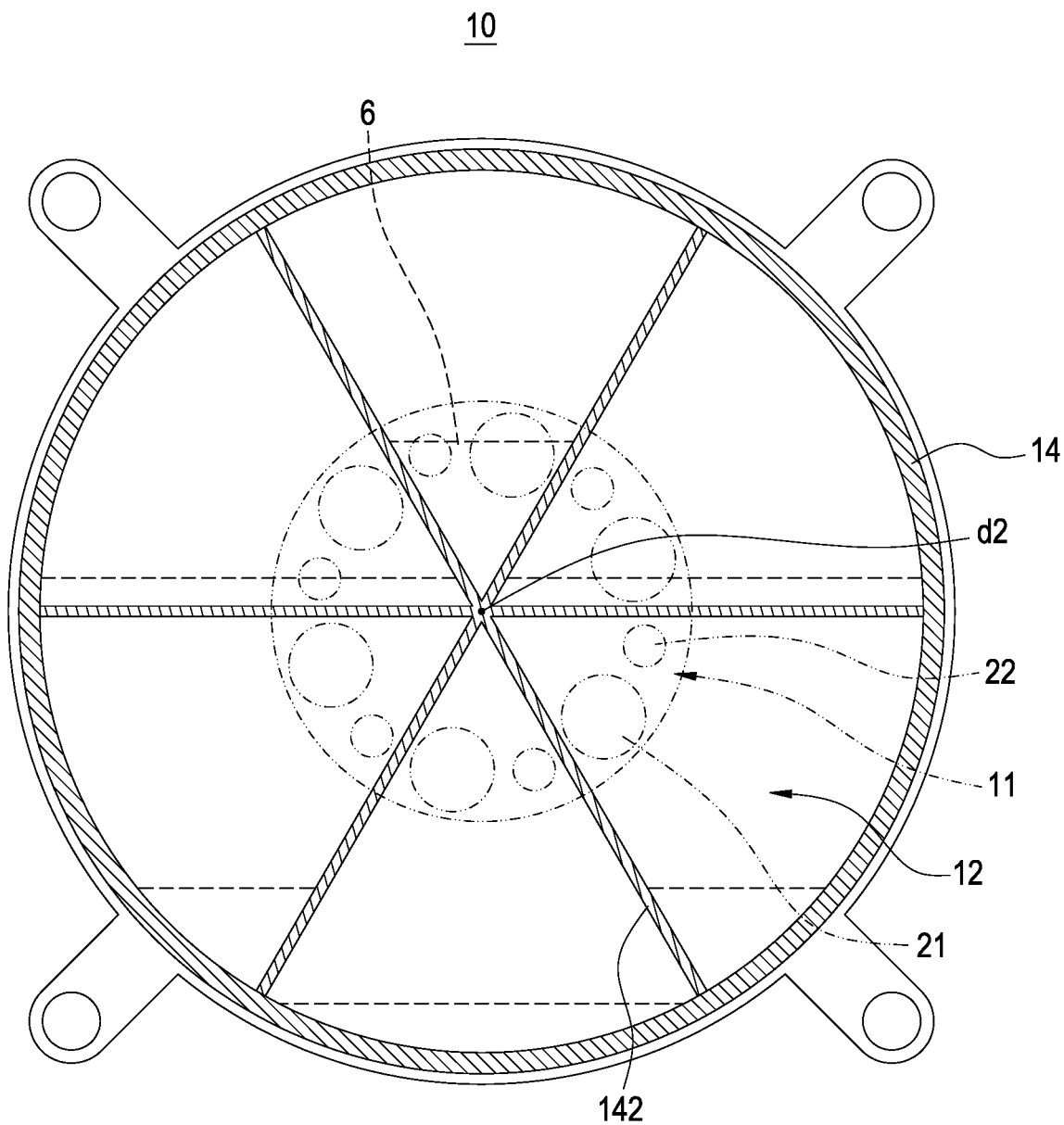
FIG. 8 is an assembly cross-sectional view of another exemplary embodiment of the liquid-cooled cooling structure of the present disclosure.

Please refer to FIG. 8, showing another exemplary embodiment of the liquid-cooled cooling structure 10 of the present disclosure. The exemplary embodiment shown in FIG. 8 is similar to the exemplary embodiment shown in FIG. 1 to FIG. 7. The difference between the exemplary embodiment shown in FIG. 8 and the exemplary embodiment shown in FIG. 1 to FIG. 7 lies in that the quantities of the first vertical separation sheet 133 (not shown in the drawing, and please refer to FIG. 1 to FIG. 2 and FIG. 5) and the second vertical separation sheet 142 are multiple.

To be more specific, the quantities of the first vertical separation sheet 133 (not shown in drawing, and please refer to FIG. 1 to FIG. 2 and FIG. 5) and the second vertical separation sheet 142 are three respectively. When the liquid-cooled cooling structure 10 is placed horizontally, since the three first vertical separation sheets 133 divide the internal of the hollow column 13 equally to form six condensation chambers 11 with the first axial line d1 as the central line, and the three second vertical separation sheets 142 divides the internal of the disk housing 14 equally to form six evaporation chambers 12 with the second axial line d2 as the central line, the internal of the cooling main body 1 is evenly divided into a plurality of sections with the center point as the datum point, and each section is also uniformly filled with the working fluid 6, thereby ensuring that the central area of the disk housing 14 that is typically attached to the heat source contains a greater predefined amount of the working fluid 6. In other words, it is able to ensure that a greater predefined amount of working fluid 6 maintains direct contact with the heat source. Accordingly, as the quantities of the first separation sheet (not shown in drawing, and please refer to FIG. 1 to FIG. 2 and FIG. 5) and the second vertical separation sheet 142 increase, a greater amount of working fluid 6 may be retained at the central area of the disk housing 14.

In view of the above, the liquid-cooled cooling structure of the present disclosure is able to achieve the expected purpose of use and to overcome known drawbacks. In addition, the present disclosure is of novelty and inventive step such that it complies with the patentability requirements completely. Accordingly, the present application is hereby filed to protect the rights of the inventor.

What is claimed is:

1. A liquid-cooled cooling structure, comprising:
a cooling main body, comprising at least one condensation chamber and at least one evaporation chamber arranged parallelly along a vertical direction in an internal thereof;
a separation member, arranged between and separating the at least condensation chamber and the at least one evaporation chamber, comprising at least one first through hole and at least one second through hole communicating with the at least one condensation chamber and the at least one evaporation chamber, wherein a dimension of the first through hole is greater than a dimension of the second through hole;
at least one longitudinal partition board, received in the at least one condensation chamber and arranged between the at least one first through hole and the at least one second through hole, wherein the longitudinal partition board separates the condensation chamber into a first channel and a second channel, the first channel and the second channel communicate with each other at one ends thereof, the first channel communicates with the first through hole at another end, and the second channel communicates with the second through hole at another end; and
a plurality of cooling fins, extended from an outer perimeter of the cooling main body;
wherein the cooling main body comprises a hollow column and a disk housing stacked on each other vertically, the hollow column comprises the at least one condensation chamber defined inside, at least one first opening and at least one second opening communicating with the at least one condensation chamber, the disk housing comprises the at least one evaporation chamber defined inside and at least one penetrating hole defined on a central top portion thereof and communicating with the at least one evaporation chamber, and the at least one first opening and the at least one penetrating hole are filled and sealed by the separation member.

2. The liquid-cooled cooling structure according to claim 1, further comprising at least one sealing cap, covering and sealing the at least one second opening, the plurality of cooling fins extended from an outer perimeter of the hollow column.

3. The liquid-cooled cooling structure according to claim 2, wherein quantities of the condensation chamber, the evaporation chamber, the first through hole, the second through hole, the longitudinal partition board, the penetrating hole, a slot, the first opening, the second opening and the sealing cap are multiple respectively, each first through hole and each second through hole communicate with each condensation chamber and each evaporation chamber, each longitudinal partition board is received in each condensation chamber and arranged between each first through hole and each second through hole, each penetrating hole communicates with each evaporation chamber, each slot is arranged between each first through hole and each second through hole, each first opening and each second opening communicate with each condensation chamber, each second opening is covered and sealed by each sealing cap.

4. The liquid-cooled cooling structure according to claim 3, wherein the separation member comprises a plurality of lateral partition boards, each first through hole and each second through hole are defined on each lateral partition board, each first opening and each penetrating hole are filled and sealed by each lateral partition board.

5. The liquid-cooled cooling structure according to claim 4, wherein each one of the lateral partition boards comprises the slot disposed on a top portion thereof and arranged between each first through hole and each second through hole, a spacing is defined between one end of each longitudinal partition board and each sealing cap, and another end of each longitudinal partition board is inserted in each the slot.

6. The liquid-cooled cooling structure according to claim 3, wherein the hollow column comprises a first axial line defined therein, the plurality of condensation chambers is divided by at least one first vertical separation sheet, the first vertical separation sheet is extended between two sides of an inner perimeter of the hollow column to intersect with the first axial line and disposed along the first axial line.

7. The liquid-cooled cooling structure according to claim 6, wherein two sides of each longitudinal partition board are extended from the inner perimeter of the hollow column and the first vertical separation sheet, and are disposed along the first axial line.

8. The liquid-cooled cooling structure according to claim 6, wherein an inner perimeter of the plurality of first openings and an inner perimeter of the plurality of second openings are jointly enclosed by the inner perimeter of the hollow column and an outer side of the at least one first vertical partition sheet.

9. The liquid-cooled cooling structure according to claim 3, wherein the disk housing comprises a second axial line defined therein, the plurality of evaporation chambers is divided by at least one second vertical separation sheet, the second vertical separation sheet is extended from an inner top wall, an inner bottom wall and two sides of an inner perimeter of the disk housing to intersect with the second axial line, and disposed along the second axial line.

10. The liquid-cooled cooling structure according to claim 1, further comprising a working fluid, received in the at least one condensation chamber and the at least one evaporation chamber.

* * * * *